United States Patent [19]

Ichikawa et al.

[11] Patent Number: 5,374,581

[45] Date of Patent: Dec. 20, 1994

[54] METHOD FOR PREPARING SEMICONDUCTOR MEMBER

[75] Inventors: Takeshi Ichikawa, Zama; Takao Yonehara; Kiyofumi Sakaguchi, both of Atsugi, all of Japan

[73] Assignee: Canon Kabushiki Kaisha, Tokyo, Japan

[21] Appl. No.: 127,113

[22] Filed: Sep. 27, 1993

Related U.S. Application Data

[63] Continuation of Ser. No. 922,513, Jul. 31, 1992, abandoned.

[30] Foreign Application Priority Data

Jul. 31, 1991 [JP] Japan .................................. 3-213149
Jul. 31, 1991 [JP] Japan .................................. 3-213150

[51] Int. Cl.$^5$ .......................................... H01L 21/302
[52] U.S. Cl. .......................................... 437/62; 437/71; 437/86; 437/235; 437/974; 148/DIG. 12
[58] Field of Search .................. 437/62, 71, 86, 235, 437/974; 148/DIG. 12; 156/654, 657

[56] References Cited

U.S. PATENT DOCUMENTS

| | | | |
|---|---|---|---|
| 4,177,094 | 12/1979 | Kroon | 437/86 |
| 4,806,996 | 2/1989 | Luryi | 437/131 |
| 4,897,362 | 1/1990 | Delgado | 437/86 |
| 4,962,051 | 10/1990 | Liaw | 437/62 |
| 5,013,681 | 5/1991 | Godbey et al. | 437/62 |
| 5,110,748 | 5/1992 | Sarma | 437/86 |

OTHER PUBLICATIONS

Edited by G. W. Cullen, "Single-Crystal Silicon On Non-Single-Crystal Insulators," *Journal of Crystal Growth*, vol. 63, No. 3, Oct. 11, 1983, pp. 429–590.
K. Imai et al., "Crystalline Quality of Silicon Layer Formed By FIPOS Technology," *Journal of Crystal Growth*, vol. 63, No. 3, Oct. 11, 1983, pp. 547–553 (see above publication, edited by G. W. Cullen, for this article).
A. Uhlir, Jr., "Electrolytic Shaping of Germanium and Silicon," *The Bell System Technical Journal*, vol. XXXV, Mar. 1956, pp. 333–347.
T. Unagami, "Formation Mechanism of Porous Silicon Layer by Anodization in HF Solution," *Journal of the Electrochemical Society*, vol. 127, No. 2, Feb. 1980, pp. 476–483.
K. Imai, "A New Dielectric Isolation Method Using Porous Silicon," *Solid-State Electronics*, vol. 24, 1981, pp. 159–164.
T. Ohmi et al., "Formation of device-grade epitaxial silicon films at extremely low temperatures by low-energy bias sputtering," vol. 66, No. 10, Nov. 15, 1989, pp. 4756–4766.

Primary Examiner—R. Bruce Breneman
Assistant Examiner—Ramamohan Rao Paladugu
Attorney, Agent, or Firm—Fitzpatrick, Cella, Harper & Scinto

[57] ABSTRACT

A method for preparing a semiconductor member comprising steps of: making a silicon substrate porous; forming a non-porous silicon monocrystalline layer on the porous silicon substrate at a first temperature; bonding a surface of the non-porous silicon monocrystalline layer on to another substrate having an insulating material on the surface thereof; etching the porous silicon by removing the porous silicon of the bonded substrate by chemical etching; and forming a monocrystalline silicon layer on the non-porous silicon monocrystalline layer by epitaxial growth at a second temperature higher than the first temperature.

11 Claims, 10 Drawing Sheets

METHOD FOR PREPARING SEMICONDUCTOR MEMBER

This application is a continuation of application Ser. No. 07/922,513 filed Jul. 31, 1992, now abandoned.

BACKGROUND OF THE INVENTION

1. Field of the Invention

The present invention relates to a method for preparing a semiconductor member, and more particularly to a method for preparing a semiconductor member suitable for the dielectric isolation, or an electronic device or integrated circuit created on a monocrystalline semiconductor layer on an insulating material.

2. Related Background Art

Formation of a monocrystalline Si semiconductor layer on an insulating material has been widely known as the silicon on insulator (SOI) technology, and since a large number of advantages which cannot be reached by bulk Si substrates for preparation of conventional Si integrated circuits are possessed by the device utilizing the SOI structure, so many researches have been done. More specifically, by utilizing the SOI structure, the following advantages can be obtained:

① Dielectric isolation can be easily done to enable high degree of integration;
② Radiation hardness is excellent;
③ Stray capacity is reduced to attain high speed;
④ Well formation step can be omitted;
⑤ Latch-up can be prevented;
⑥ Fully depleted field effect transistor can be made by thin film formation.

In order to realize the many advantages in device characteristics as mentioned above, studies have been made about the method for forming the SOI structure for these some 10 years. The contents are summarized in, for example, the literature as mentioned below:

Special Issue: "Single-crystal silicon on non-single-crystal insulators"; edited by G. W. Cullen, Journal of Crystal Growth, volume 63, No. 3, pp. 429–590 (1983).

Also, it has been known for a long time to form the SOS (silicon on sapphire) structure by heteroepitaxy of Si on a monocrystalline sapphire substrate by CVD (chemical vapor deposition) method. This was successful to some extent as the most mature SOI technique, but for such reasons as a large amount of crystal defects because of lattice mismatching at the interface between the Si layer and the underlaid sapphire substrate, introduction of aluminum from the sapphire substrate into the Si layer, and above all the high price of the substrate and delay in enlargement of the substrate wafer size, it is obstructed from being widely applied.

Relatively in recent years, attempts to realize the SOI structure without use of a sapphire substrate have been done. Such attempts may be broadly classified into the two technologies shown below:

1. After surface oxidation of an Si monocrystalline substrate, a window is formed to have the Si substrate partially exposed, and epitaxial growth is proceeded in the lateral direction with that exposed portion as the seed to form an Si monocrystalline layer on $SiO_2$. (In this case, deposition of Si layer on $SiO_2$ is accompanied).

2. By use of an Si monocrystalline substrate itself as an active layer, $SiO_2$ is formed therebeneath. (This method is accompanied with no deposition of Si layer.)

As the means for realizing the above 1, there have been known the methods in which:

a monocrystalline Si layer is formed directly to lateral epitaxial growth by CVD;

amorphous Si is deposited and subjected to solid phase lateral epitaxial growth by heat treatment;

an amorphous or polycrystalline Si layer is irradiated convergently with an energy beam such as electron beam, laser beam, etc., and a monocrystalline layer is grown on $SiO_2$ by melting and recrystallization; and a melting region is scanned in a zone fashion by a rod-shaped heater (Zone melting recrystallization).

These methods have both advantages and disadvantages, they still have many problems with respect to controllability, productivity, uniformity and quality, and none of them have been industrially applied yet up to date.

For example, the CVD method requires the sacrificial oxidation in flat thin film formation, while the crystallinity is poor in the solid phase growth method.

On the other hand, in the beam annealing method, problems are involved in controllability such as treatment time by converged beam scanning, the manner of overlapping of beams, focus adjustment, etc.

Among these, the Zone Melting Recrystallization method is the most mature, and a relatively larger scale integrated circuit has been trially made, but still a large number of crystal defects such as subboundary remain, and no device driven by minority carriers has been prepared.

Concerning the method using no Si substate as the seed for epitaxial growth which is the above method 2, for example, the following three methods may be included.

1. An oxide film is formed on an Si monocrystalline substrate with V-grooves as anisotropically etched on the surface, a polycrystalline Si layer is deposited on the oxide film thick to the extent as the Si substrate, and thereafter by polishing from the back surface of the Si substrate, Si monocrystalline regions dielectrically separated by surrounding with the V-grooves on the thick polycrystalline Si layer are formed.

In this method, although crystallinity is good, there are problems with respect to controllability and productivity as it requires a process of depositing the polycrystalline Si thick as some hundreds μm, and a process in which the monocrystalline Si substrate is polished from the back surface to leave only the Si active layer as separated.

2. This is the method called SIMOX (Separation by Ion Implanted Oxygen) in which an $SiO_2$ layer is formed by ion implantation of oxygen into an Si monocrystalline substrate, which is one of the most mature methods at present because of good matching with the Si process.

However, for formation of the $SiO_2$ layer, $10^{18}$ ions/cm² or more of oxygen ions are required to be implanted, and the implantation time is very long to be not high in productivity, and also the wafer cost is high. Further, many crystal defects remain, and from an industrial point of view, no sufficient level of quality capable of preparing a device driven by minority carriers have been attained.

3. This is the method to form an SOI structure by dielectric isolation according to oxidation of porous Si. This is a method in which an N-type Si layer is formed on the surface of a P-type Si monocrystalline substrate in shape of islands by way of proton ion implantation (Imai et al., J. Crystal Growth, vol. 63, 547 (1983)), or by epitaxial growth and patterning; only the P-type Si substrate is made porous by anodization in the HF solution so as to surround the Si islands from the surface; and then the N-type Si islands are dielectrically isolated by accelerated oxidation.

In this method, the separated Si region is determined before the device steps, whereby there is the problem that the degree of freedom in device design may be limited in some cases.

Generally, on a light-transparent substrate represented by a glass, the deposited thin film Si layer is only formed as an amorphous layer or, at best, a polycrystalline layer because of reflecting the disorder of the crystal structure thereof, and it is therefore difficult to produce a high quality device. This is because the substrate has an amorphous crystal structure, and thus a monocrystalline layer of high quality cannot be easily obtained by simply depositing the Si layer.

By the way, the light-transparent substrate which is one of the insulating substrates is important for constituting a contact sensor serving as a light-receiving device and a projection-type liquid crystal image display, and a high-quality driving device is required for further increasing the density, resolution and definition of the pixels (picture elements) of such a sensor or display. It is consequently necessary to produce a device to be provided on a light-transparent substrate by using a monocrystalline layer having excellent crystallinity.

It is therefore difficult to produce a driving device having properties sufficient for the present demands or future demands because the crystal structure of an amorphous Si or polycrystalline Si has many defects.

Therefore, there is the problem that any of the above-mentioned methods is difficult to provide an SOI layer having excellent crystallinity equal to that of the Si wafer on a light-transparent glass substrate which is one of the insulating substrates.

The removal of porous Si layer by chemical etching which is a requisite process for the method of the present invention will be described below.

In general, $$P = (2.33 - A)/2.33 \tag{1}$$

is called the porosity. This value can be changed by anodization, and expressed as follows.

$$P = (m1 - m2)/(m1 - m3) \tag{2}$$

or $$P = (m1 - m2)/\rho A_t \tag{3}$$

m1: Total weight before anodization
m2: Total weight after anodization
m3: Total weight after removal of porous Si
ρ: Density of monocrystalline Si
A: Area of porous region
t: Thickness of porous Si However, the area of porous region cannot be accurately calculated in some cases. In such a case, although the expression (2) is effective, the porous Si must be etched for measuring the value of m3.

In addition, during epitaxial growth on the porous Si, the porous Si is capable of relieving distortion produced during heteroepitaxial growth and suppressing the occurrence of defects owing to its structural property.

However, in this case, it is clear that the porosity of porous Si is a very important parameter. Therefore, the above-mentioned measurement of the porosity is necessary and indispensable in this case.

Known methods of etching porous Si are the following methods (1) and (2):
1. The method of etching porous Si with an aqueous NaOH solution (G. Bonchil, R. Herino, K. Barla, and J. C. Pfister, J. Electrochem. Soc., vol. 130, No. 7, 1611 (1983));
2. The method of etching porous Si with an etching solution which is capable of etching monocrystalline Si.

In the above method 2, an etching solution of fluoronitric type is generally used, and etching of Si proceeds as follows:

$$Si + 2O \rightarrow SiO_2 \tag{4}$$

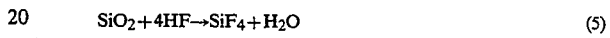

$$SiO_2 + 4HF \rightarrow SiF_4 + H_2O \tag{5}$$

As shown, Si is oxidized by nitric acid to $SiO_2$, and the $SiO_2$ produced is etched by hydrofluoric acid.

Examples of etching solutions of crystalline Si include the above fluoronitric acid-type etching solution as well as ethylenediamine-type, KOH-type, and hydrazine-type etching solution and the like.

From these respects, it is necessary in selective etching of porous Si to select an etching solution which is capable of etching porous Si, other than the above Si etching solutions. Conventionally, the porous Si is generally selectively etched only by using an aqueous NaOH solution as an etching solution.

As above mentioned, both porous Si and monocrystalline Si are etched with the fluoronitric acid-type etching solution.

On the other hand, in the conventional method of selectively etching porous Si with an aqueous NaOH solution, Na ions are inevitably adsorbed on the etched surface.

Since this Na ions cause impurity contamination, are movable and have adverse effects such as the formation of interfacial states, the ions must not be introduced into the semiconductor process.

SUMMARY OF THE INVENTION

An object of the present invention is to provide a method for preparing a semiconductor member which can resolve the aforementioned problems and meet the aforementioned requirements by using a bonding method.

Another object of the present invention is to provide a method for preparing a semiconductor member which is superior in the respects of productivity, uniformity, controllability and cost to obtain a crystalline Si layer having excellent crystallinity equal to that of a monocrystalline wafer on insulating substrates represented by a transparent glass substrate (light-transparent substrate).

Further, another object of the present invention is to provide a method for preparing a semiconductor member which is capable of realizing the advantages of conventional SOI devices and can be applied to various fields.

Further, still another object of the present invention is to provide a method for preparing a semiconductor member which can also be used in place of the expensive SOS or SIMOX used for producing a large-scale integrated circuit having the SOI structure.

DETAILED DESCRIPTION OF THE PREFERRED EMBODIMENTS

The preferred embodiment for the method for preparing a semiconductor member according to the present invention is as follows.

That is, the method for preparing a semiconductor member according to the present invention is characterized by including the steps of:

making a silicon substrate porous, forming a non-porous silicon monocrystalline layer on said porous silicon substrate at a first temperature, bonding a surface of said non-porous silicon monocrystalline layer on the another substrate having an insulating material on the surface thereof, etching the porous silicon by removing said porous silicon of said bonded substrate by chemical etching, and forming a monocrystalline silicon layer on said non-porous silicon monocrystalline layer by epitaxial growth at a second temperature higher than said first temperature.

The present invention makes it possible to provide a method for preparing a semiconductor member which is excellent in productivity, uniformity, controllability and economy for forming a crystalline Si layer having excellent crystallinity equal to that of a monocrystalline wafer on insulating substrates.

Further, the present invention makes it possible to provide a method for preparing a semiconductor member which is capable of realizing the advantages of conventional SOI devices and can be applied to various fields.

Further, the present invention makes it possible provide a method for preparing a semiconductor member which can also be used in place of the expensive SOS or SIMOX used for producing a large-scale integrated circuit having the SOI structure.

Also, the present invention makes it possible to provide a method for preparing a semiconductor member which uses a wet chemical etching solution which has no adverse effects on the semiconductor process in etching of porous Si and exhibits an etching selection ratio of a five digits value or more of porous Si to non-porous Si and excellent controllability and productivity.

According to the present invention, it is possible to form a silicon layer having a good monocrystalline structure on an insulating material by changing the non-porous silicon growth temperature (first temperature) on a porous substrate before selective etching and the monocrystalline silicon growth temperature (second temperature) on a non-porous silicon after selective etching.

Referring now to FIGS. 1A to 1F, the method for preparing a semiconductor member according to the present invention will be described below.

Figure 1A:
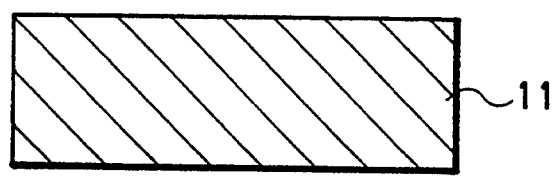
FIGS. 1A to 1F are schematic views showing an example for the process of the present invention.

First, an Si monocrystalline substrate 11 is prepared and the whole substrate is made porous, as shown in FIG. 1A. The Si substrate is made porous by anodization using an HF solution. The density of the porous Si layer can be changed to the range of 1.1 to 0.6 g/cm³ by changing the concentration of the HF solution from 50 to 20%, as compared with the density of 2.33 g/cm³ of monocrystalline Si.

The porous layer for use in the present invention is easily formed into a P-type Si substrate due to the following reasons.

Porous Si as a porous semiconductor for use in the present invention was discovered in the course of research on electrolytic polishing of a semiconductor which was conducted by Uhlir et al, in 1956 (A. Uhlir, Bell Syst. Tech. J., Vol. 35, pp 333 (1956)).

Unagami et al. investigated dissolving reaction of Si during anodization and reported that the anodic reaction of Si in an HF solution requires positive holes, and that the reaction is expressed as follows (T. Unagami, J. Electrochem. Soc., Vol. 127, pp 476 (1980)):

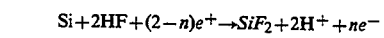

$Si + 2HF + (2-n)e^+ \rightarrow SiF_2 + 2H^+ + ne^-$

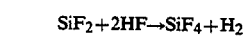

$SiF_2 + 2HF \rightarrow SiF_4 + H_2$

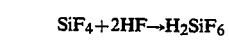

$SiF_4 + 2HF \rightarrow H_2SiF_6$ or

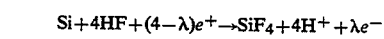

$Si + 4HF + (4-\lambda)e^+ \rightarrow SiF_4 + 4H^+ + \lambda e^-$

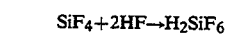

$SiF_4 + 2HF \rightarrow H_2SiF_6$ wherein e⁺ and e⁻ respectively denote a positive hole and an electron, and n and λ each denotes the number of positive holes required for dissolving one Si atom. Porous Si can be formed when the condition, n>2 or λ>4, is satisfied.

From the above reason, it is generally found that the P-type Si can be made porous because of the existence of positive holes, but the N-type Si is not made porous. This selectivity in making porous structure has been proven by Nagano et al. and Imai (Nagano, Nakajima, Yasuno, Ohnaka, Kajiwara, Electronic Communication Institute Technical Studies Report, Vol. 79, SSD79 9549 (1979), (K. Imai, Solid-State Electronics, vol. 24, 159 (1981)).

Also, the porous layer contains a great amount of voids formed internally, the density is reduced half or less. As a result, the surface area greatly increases as compared with the volume, and the chemical etching rate is remarkably accelerated as compared with the etching rate for an ordinary monocrystalline layer.

Figure 1B:
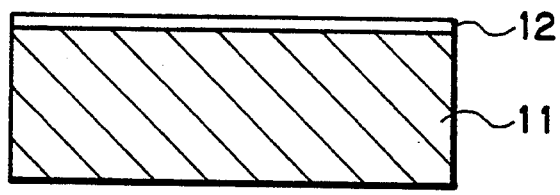

Then the epitaxial growth is conducted on the surface of porous substrate by any of a variety of low temperature growth methods to form a thin film non-porous silicon monocrystalline layer 12 at a first temperature, as shown in FIG. 1B.

This first temperature is required not to chance the porous Si so that the selection ratio of porous Si layer to non-porous silicon monocrystalline layer can be sufficiently obtained by a later selective etching, and may be as low as possible unless crystal defects occur on the non-porous silicon monocrystalline layer formed on the porous Si.

Figure 1C:
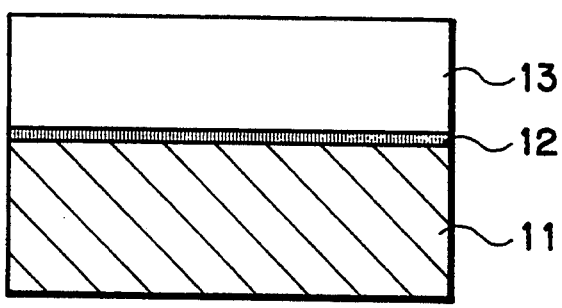

Subsequently, a light-transparent substrate 13 is prepared as an example of insulating substrate, and bonded on to a non-porous silicon monocrystalline layer 12 on the porous Si substrate 11, as shown in FIG. 1C.

Figure 1D:
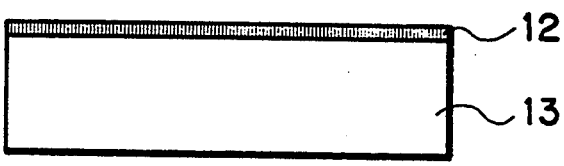

Afterwards, the porous Si substrate 11 is entirely immersed in a selective etching solution which may be hydrofluoric acid (or buffered hydrofluoric acid, thereinafter abbreviated as BHF), a mixture of hydrofluoric acid (or BHF) and hydrogen peroxide, a mixture of hydrofluoric acid (or BHF) and alcohol, or a mixture of hydrofluoric acid (or BHF), hydrogen peroxide and alcohol, without agitation if alcohol exists, or otherwise with agitation, so that only on the porous Si layer 11 is etched by electroless wet chemical etching, whereby a thinned non-porous silicon monocrystalline layer 12 is left on the light transparent substrate 13 (FIG. 1D).

Figure 1E:
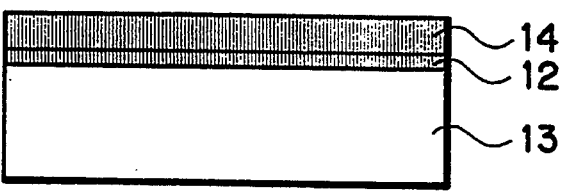

Then, a high-quality monocrystalline silicon layer 14 is formed on the non-porous silicon monocrystalline layer 12 by epitaxial growth at a second temperature, as shown in FIG. 1E. The substrate temperature at this time is not necessarily low, but is higher than the first temperature, and it is preferable to form the monocrystalline silicon layer 14 by CVD method at temperatures above 900° C.

Figure 1F:
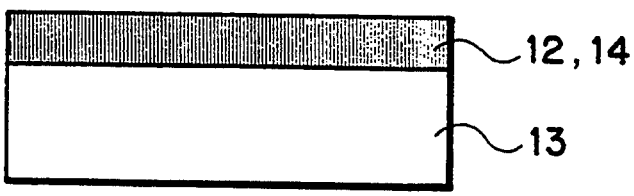

FIG. 1F shows a semiconductor substrate to be obtained with this invention. That is, the monocrystalline Si layers 12+14 having the crystallinity equivalent to that of silicon wafer are formed on the light transparent substrate 13 with high degrees of smoothness and uniformity and with a small thickness, over a wide area covering the whole surface of the wafer. The semiconductor substrate thus obtained is advantageous from the view point of production of an insulation-isolated electronic device.

Next, the selective etching for use in this invention will be described below in which the porous Si only is etched by electroless wet chemical etching.

The etching solution for use in this invention may be hydrofluoric acid (or buffered hydrofluoric acid, thereinafter abbreviated as BHF), a mixture of hydrofluoric acid (or BHF) and hydrogen peroxide, a mixture of hydrofluoric acid (or BHF) and alcohol, or a mixture of hydrofluoric acid (or BHF), hydrogen peroxide and alcohol, for example. In this case, the selective etching is preferably conducted without agitation if alcohol exists, or otherwise with agitation.

Figure 3:
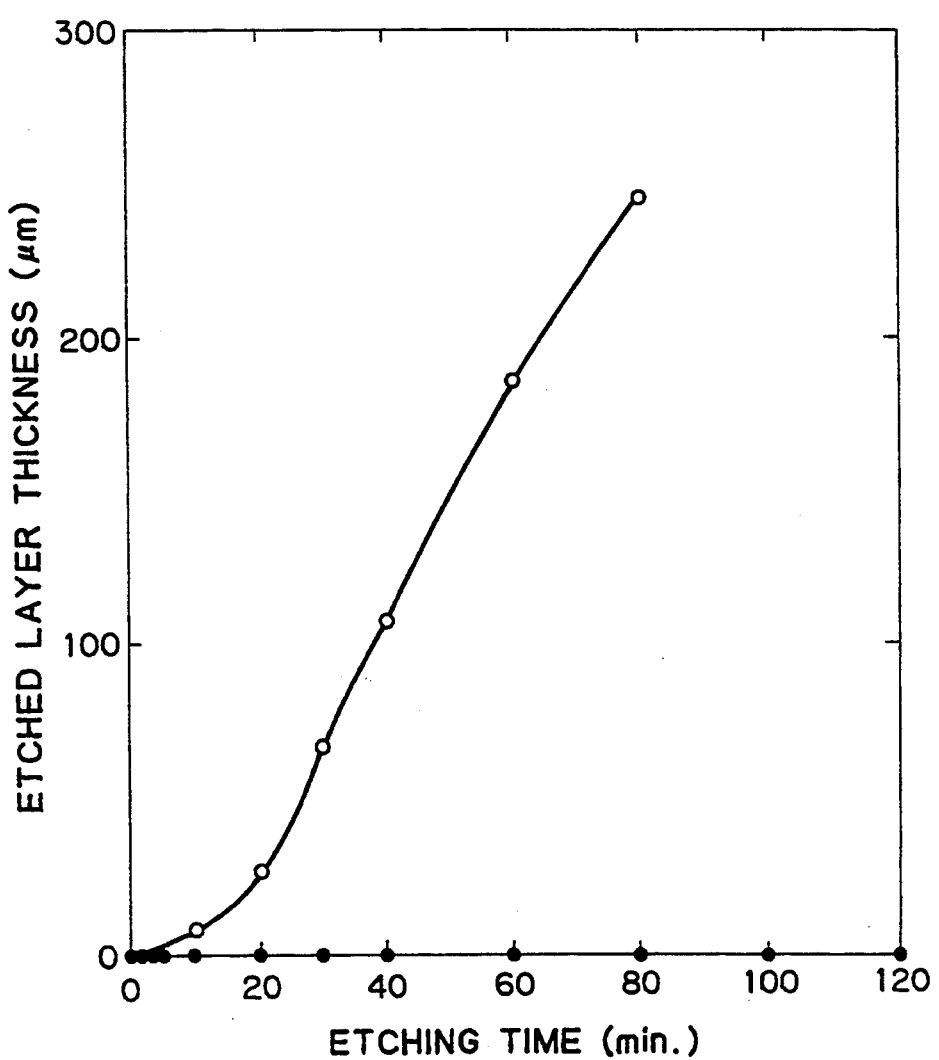
FIG. 3 is a graphic representation showing the etching characteristics of an etching solution usable for the present invention.

FIG. 3 shows the etching time dependency of etched thickness of porous Si and monocrystalline Si when the porous Si and the monocrystalline Si are etched by being immersed in a mixture of 49% hydrofluoric acid, alcohol and 30% hydrogen peroxide without agitation.

The porous Si was formed by anodizing a monocrystalline Si, and the conditions thereof are shown below as an example.

It is to be noted that the starting material for producing porous Si by anodization is not limited to monocrystalline Si and Si of other crystalline structure may be used as the starting material.

Voltage applied: 2.6 (V)
Current density: 30 (mA·cm$^{-2}$)
Anodizing solution: HF:H$_2$O:C$_2$H$_5$OH = 1:1:1
Time: 2.4 hours
Thickness of porous Si: 300 ($\mu$m)
Porosity: 56 (%)

The porous Si thus prepared under the above conditions was immersed in a mixture (10:6:50) of 49% hydrofluoric acid, alcohol and 30% hydrogen peroxide (white circles) at the room temperature without agitation. The reduction in the thickness of the porous Si was then measured.

The porous Si was rapidly etched: namely, by a layer thickness of 107 $\mu$m in 40 minutes, and further 244 $\mu$m in 80 minutes, with high degrees of surface quality and uniformity. The etching rate has dependencies on the concentration of the etching solution and the temperature.

In particular, the addition of hydrogen peroxide serves to accelerate oxidation of silicon, thus enhancing the reaction speed as compared to the case where hydrogen peroxide is not added. Furthermore, the reaction speed can be controlled by changing the ratio of the hydrogen peroxide.

Also, the non-porous Si having a thickness 500 $\mu$m was immersed in a mixture (10:6:50) of 49% hydrofluoric acid, alcohol and 30% hydrogen peroxide (black circles) at the room temperature without agitation. The reduction in the thickness of the non-porous Si was then measured.

The non-porous silicon was only etched to 100 Å or less after elapse of 120 minutes.

In particular, the addition of alcohol serves to remove bubbles of reaction product gases generated as a result of the etching without delay from the surface being etched, without necessitating agitation, thus ensuring a high efficiency and uniformity of the etching.

The porous Si and the non-porous Si after etched were then rinsed with water and the surfaces after the rinsing were examined by microanalysis using secondary ions but no impurity was detected.

The conditions for the solution concentration and the temperature can be set to fall within the ranges where the etching rate of porous Si and the etching selection ratio of porous Si to non-porous Si have no practical inconvenience in commercial production.

Figure 4:
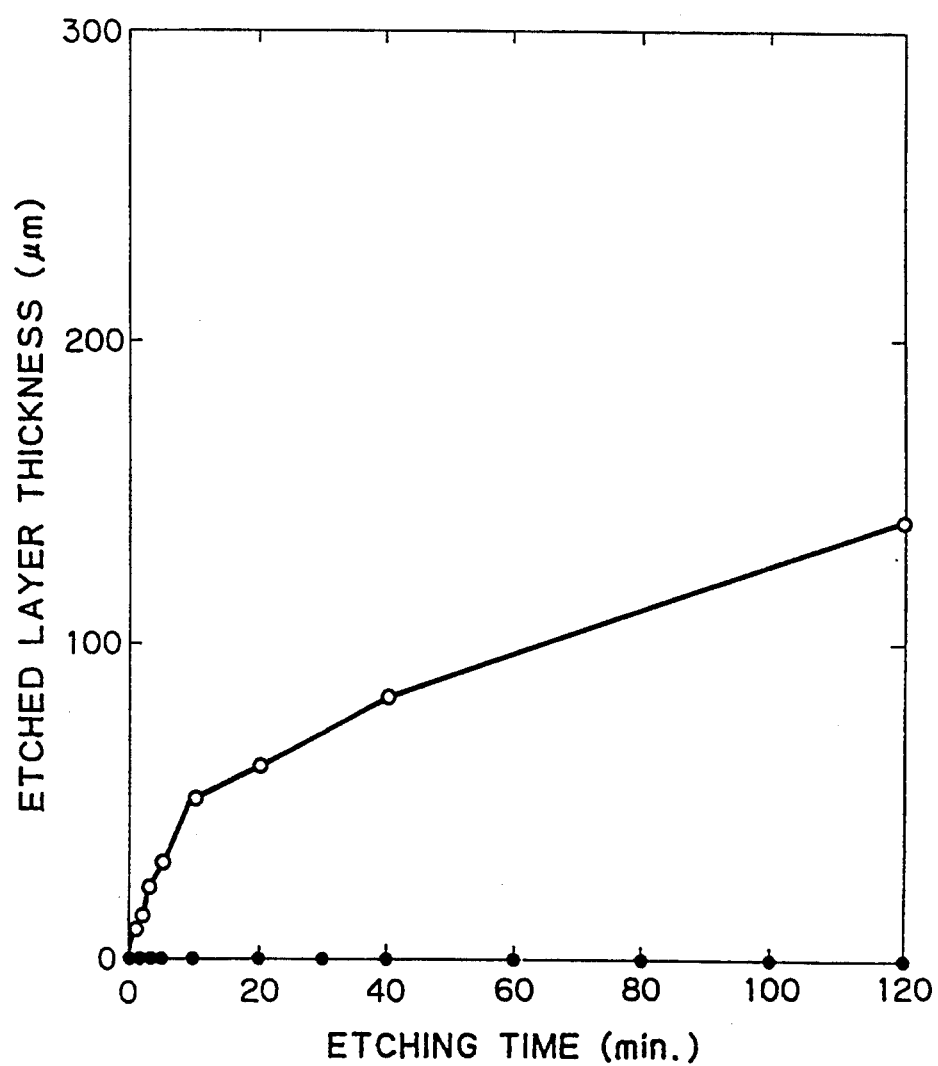
FIG. 4 is a graphic representation showing the etching characteristics of an etching solution usable for the present invention.
Figure 5:
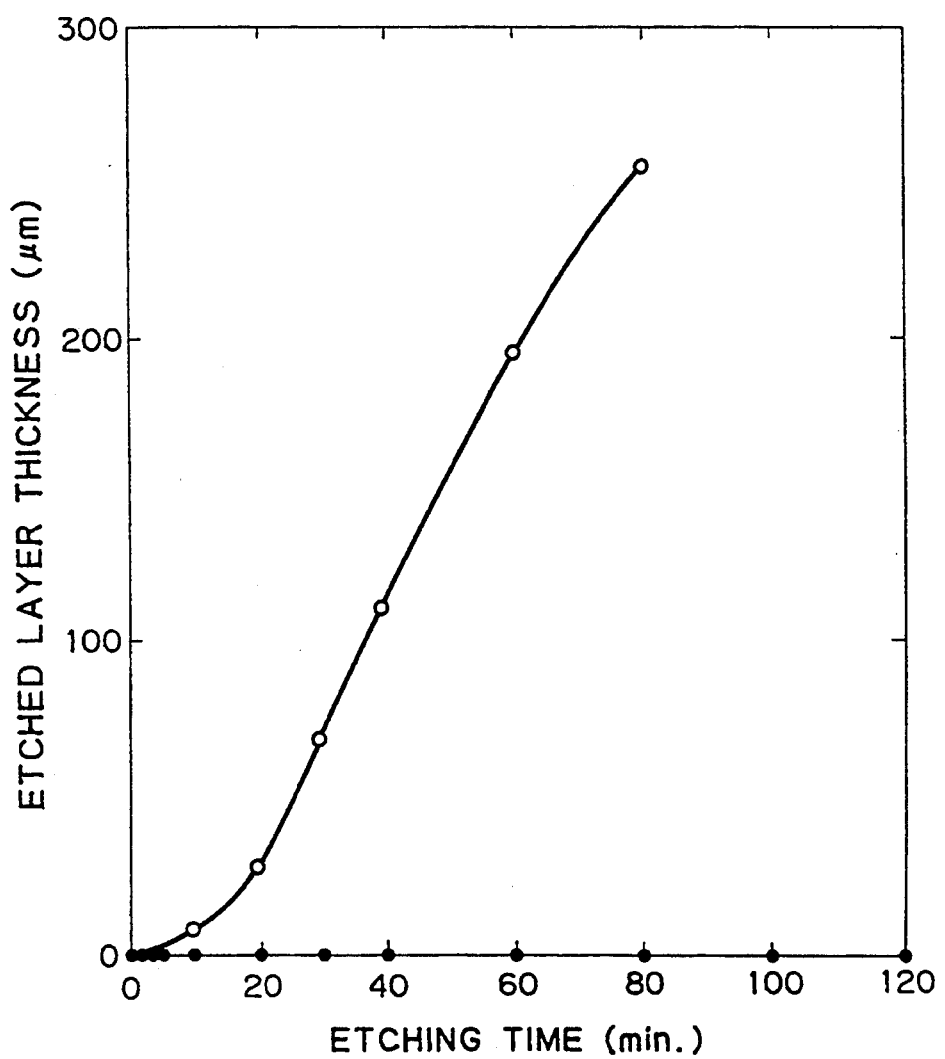
FIG. 5 is a graphic representation showing the etching characteristics of an etching solution usable for the present invention.
Figure 6:
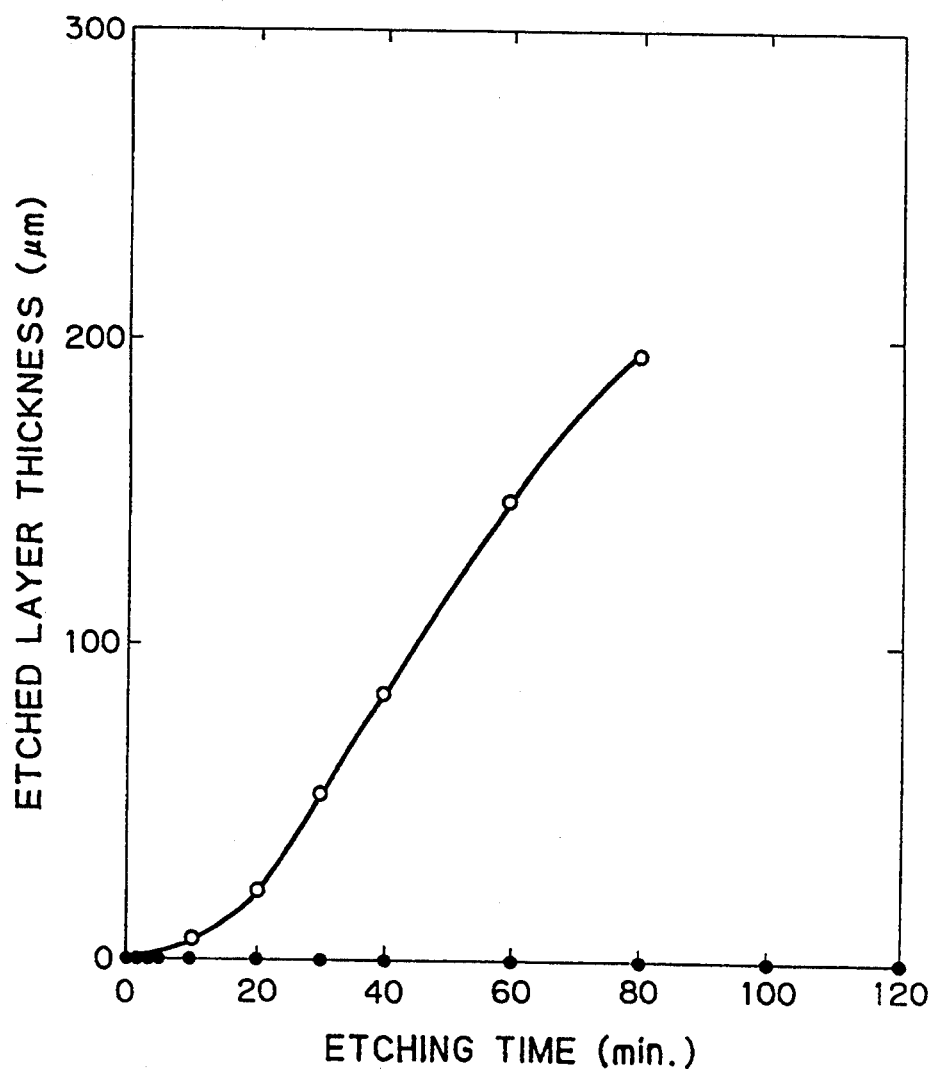
FIG. 6 is a graphic representation showing the etching characteristics of an etching solution usable for the present invention.
Figure 7:
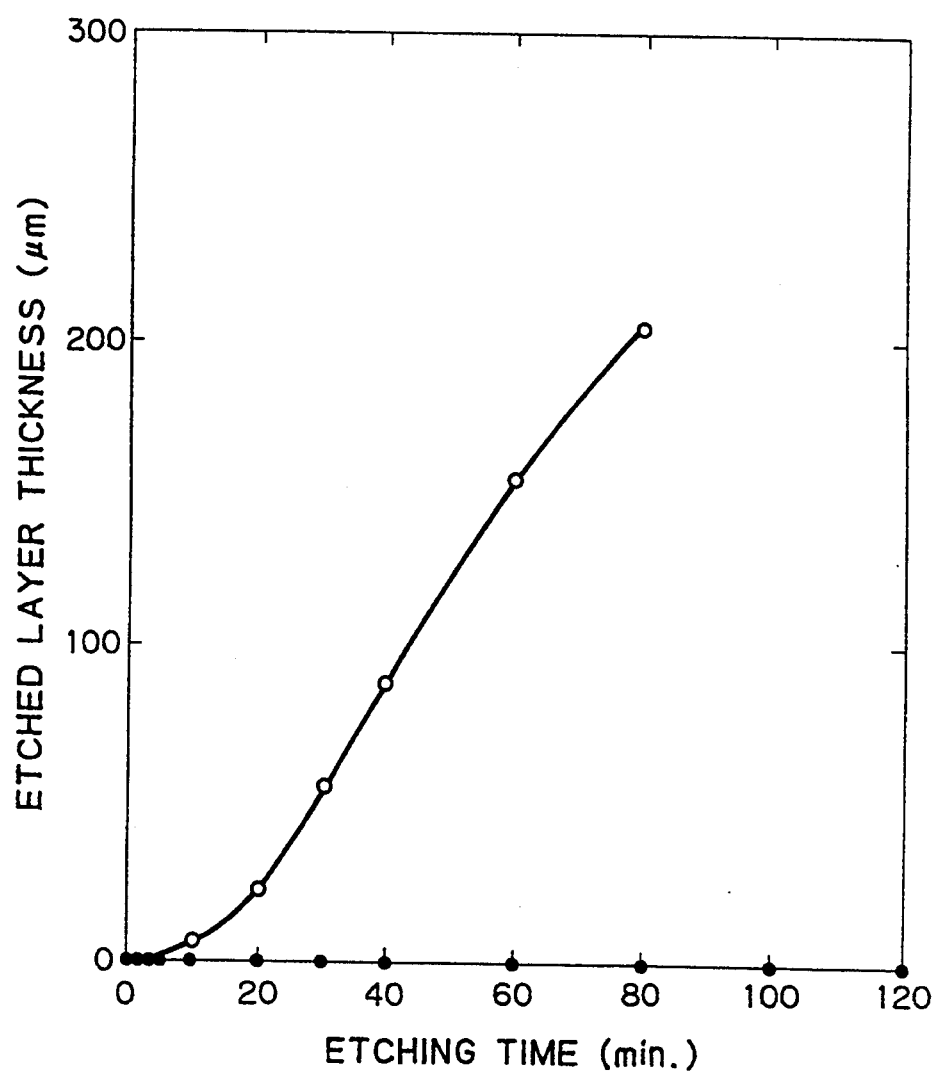
FIG. 7 is a graphic representation showing the etching characteristics of an etching solution usable for the present invention.
Figure 8:
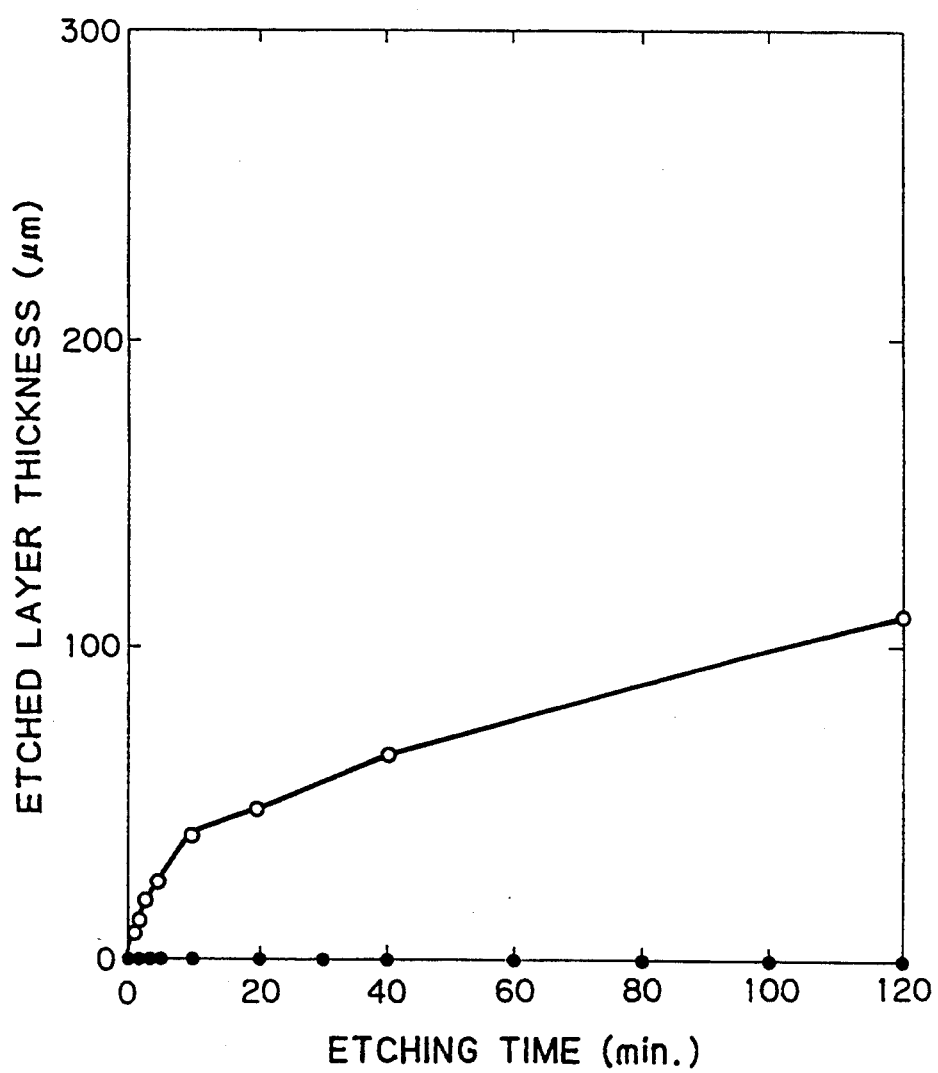
FIG. 8 is a graphic representation showing the etching characteristics of an etching solution usable for the present invention.
Figure 9:
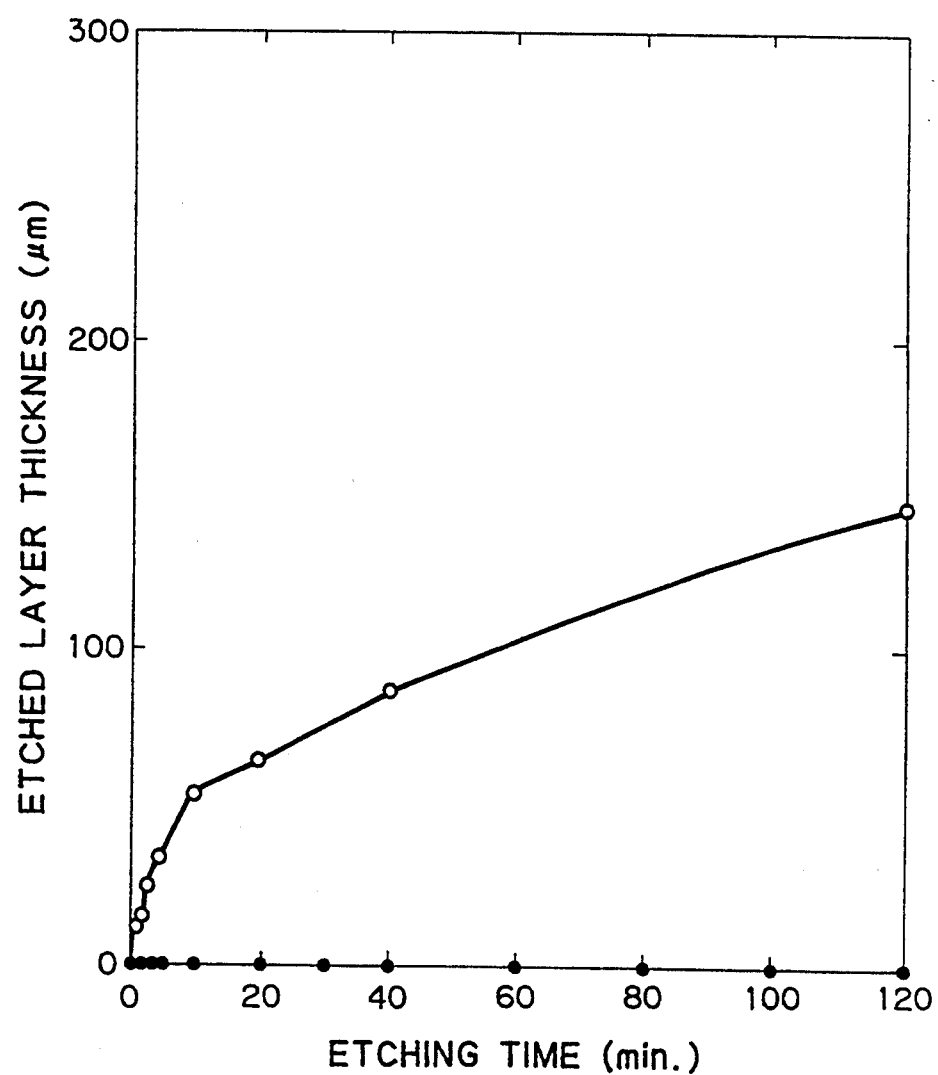
FIG. 9 is a graphic representation showing the etching characteristics of an etching solution usable for the present invention.
Figure 10:
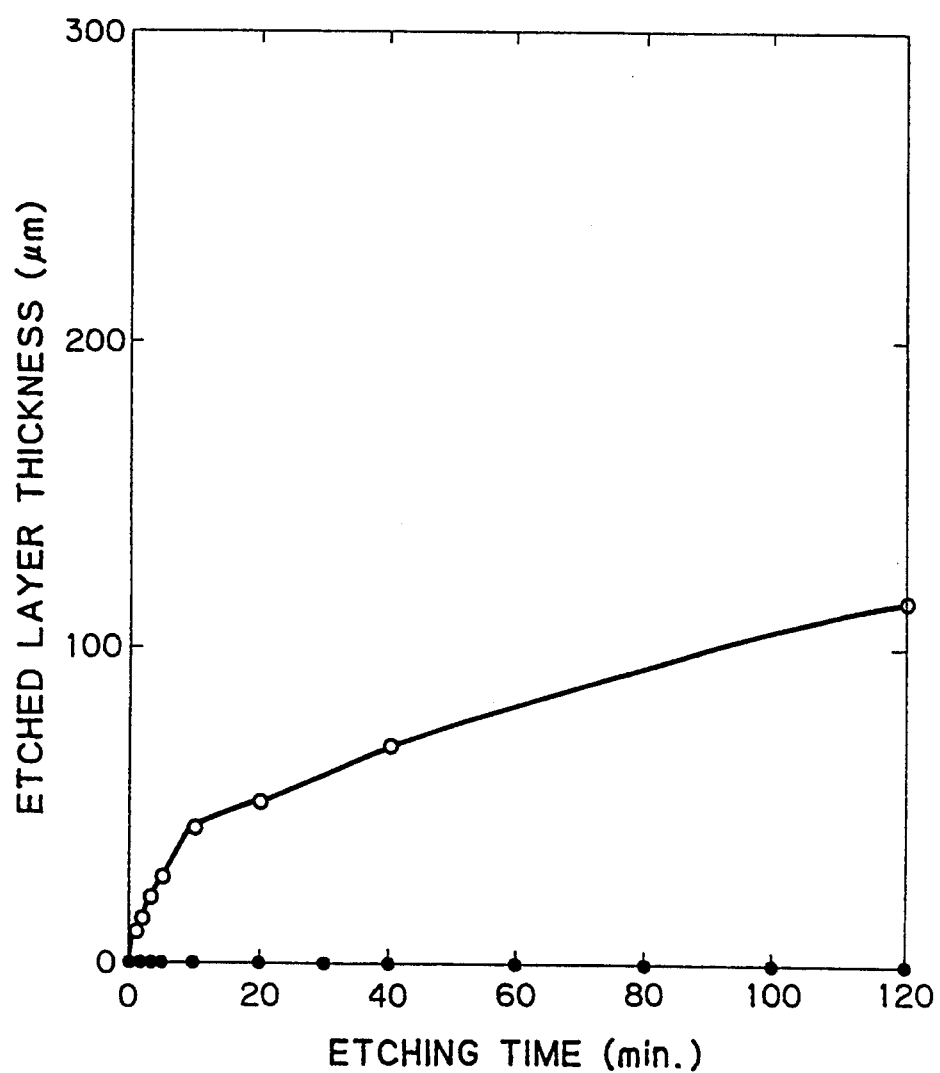
FIG. 10 is a graphic representation showing the etching characteristics of an etching solution usable for the present invention.

FIGS. 4 to 10 show the etching time dependencies of etched thickness of porous Si and monocrystalline Si in other respective etching solutions in which:

FIG. 4 shows the etching characteristics of porous Si and non-porous Si when the etching solution is a mixture of buffered hydrofluoric acid, hydrogen peroxide and alcohol;

FIG. 5 shows the etching characteristics of porous Si and non-porous Si when the etching solution is a mixture of hydrofluoric acid and hydrogen peroxide;

FIG. 6 shows the etching characteristics of porous Si and non-porous Si when the etching solution is a mixture of hydrofluoric acid and alcohol;

FIG. 7 shows the etching characteristics of porous Si and non-porous Si when the etching solution is hydrofluoric acid;

FIG. 8 shows the etching characteristics of porous Si and non-porous Si when the etching solution is a mixture of buffered hydrofluoric acid and alcohol;

FIG. 9 shows the etching characteristics of porous Si and non-porous Si when the etching solution is a mixture of buffered hydrofluoric acid and hydrogen peroxide;

FIG. 10 shows the etching characteristics of porous Si and non-porous Si when the etching solution is buffered hydrofluoric acid.

Referring now to FIGS. 2A to 2F, another example of the method for preparing a semiconductor member according to the present invention will be described below. The example as shown in FIGS. 2A to 2F are different from that as shown in FIGS. 1A to 1F are that an Si substrate 23 having an insulation layer 24 formed on the surface thereof is used as the insulating substrate.

Figure 2A:
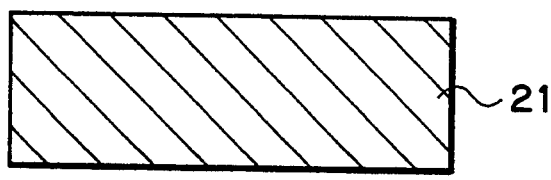
FIGS. 2A to 2F are schematic views showing another example for the process of the present invention.

First, an Si monocrystalline substrate 21 is prepared and the whole substrate is made porous, as shown in FIG. 2A.

Figure 2B:
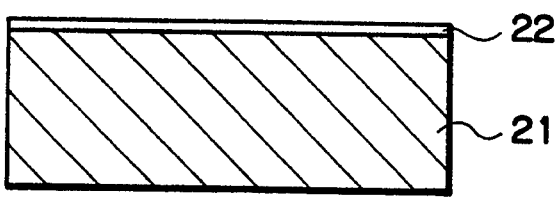

Then the epitaxial growth is conducted on the surface of porous substrate by any of a variety of low temperature growth methods to form a thin film non-porous silicon monocrystalline layer 22 at a first temperature, as shown in FIG. 2B.

This first temperature is required not to change the quality of porous Si so that the selection ratio of porous Si layer to non-porous silicon monocrystalline layer can be sufficiently obtained by a later selective etching, and may be as low as possible unless crystal defects occur on the non-porous silicon monocrystalline layer formed on the porous Si.

Figure 2C:
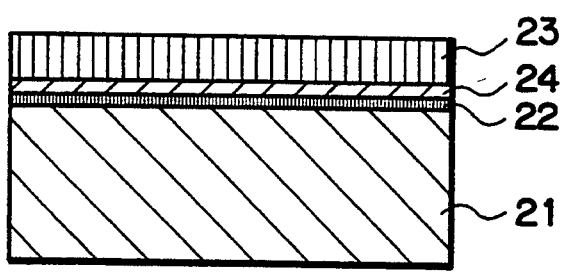

Subsequently, another Si substrate 23 is prepared and formed with the insulating material 24 on the surface thereof, and thereafter the Si substrate 23 having the insulating material 24 on the surface thereof is bonded on to the non-porous silicon monocrystalline layer 22 on the porous Si substrate 21, as shown in FIG. 2C.

Figure 2D:
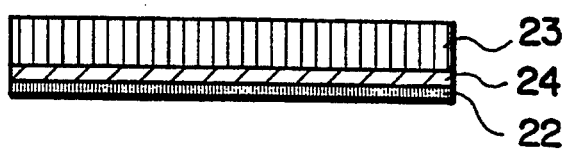

Afterwards, the entire porous Si substrate 21 is immersed in a selection etching solution which may be hydrofluoric acid (or buffered hydrofluoric acid, thereinafter abbreviated as BHF), a mixture of hydrofluoric acid (or BHF) and hydrogen peroxide, a mixture of hydrofluoric acid (or BHF) and alcohol, or a mixture of hydrofluoric acid (or BHF), hydrogen peroxide and alcohol, without agitation if alcohol exists, or otherwise with agitation, so that only the porous Si layer 21 is etched by electroless wet chemical etching, whereby a thinned non-porous silicon monocrystalline layer 12 is left on the insulating material 24 (FIG. 2D).

Figure 2E:
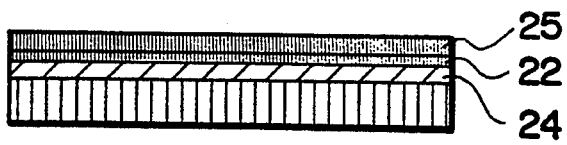

Then, a high-quality monocrystalline silicon layer 25 is formed on the non-porous silicon monocrystalline layer 22 by epitaxial growth at a second temperature, as shown in FIG. 2E. The substrate temperature at this time is not necessarily low, but is higher than the first temperature, and it is preferably to form the monocrystalline silicon layer 25 by CVD method at temperature above 900° C.

Figure 2F:
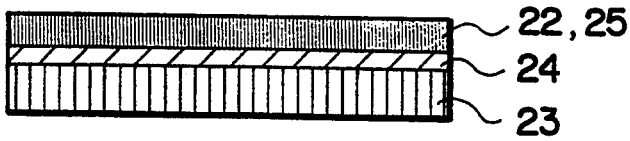

FIG. 2F shows a semiconductor substrate to be obtained with this example. That is, the monocrystalline Si layers 22+25 having the crystallinity equivalent to that of silicon wafer are formed on the insulating substrates 23+24 with high degrees of smoothness and uniformity and with a small thickness, over a wide area covering the whole surface of the wafer. The semiconductor substrate thus obtained is advantageous from the view point of production of an insulation-isolated electronic device.

In the present invention, it is desirable that the sum of the thickness of the non-porous silicon monocrystalline layer formed on porous silicon substrate at the first temperature and the thickness of the monocrystalline silicon layer formed at the second temperature is 100 microns or less.

Also, it is desirable that the non-porous silicon monocrystalline layer formed at the first temperature is epitaxially grown.

The non-porous silicon monocrystalline layer formed at the first temperature is formed with a method which is selected from bias sputtering, molecular beam epitaxial, plasma CVD, photo assisted CVD, and liquid phase growth.

The second temperature is desirably 900° C. or greater in this invention.

It is also possible to perform the etching process after covering the substrate with an anti-etching film except for the porous silicon surface.

The temperature control of the present invention will be described below.

The porous Si layer has pores having an average size of about 600 Å which was measured by observation with a transmission electron microscope. Although the porous Si layer has a density which is half or less than that of monocrystalline Si, monocrystallinity is maintained, and a monocrystalline Si layer can be formed on the porous layer by epitaxial growth.

It should be noted that if the high temperature treatment is conducted at this time, the property of porous Si may be changed, so that the characteristics of accelerated etching varies, and when the temperatures exceeds 1000° C., rearrangement of internal pores occurs, which may degrade the characteristics of accelerated etching. Therefore, the non-porous silicon epitaxial growth of Si layer on the porous silicon layer is necessary to be carried out at low temperatures.

Examples of suitable methods for such a low temperature growth include a plasma CVD method, a photo assisted CVD method, a bias sputter method, and a liquid phase growth method, and in particular, the bias sputtering method is most preferable because the epitaxial growth without crystal defects can be realized at low temperatures below 300° C. (T. Ohmi, T. Ichikawa, H. Iwabuchi, and T. Shibata, J. Appl. Phys. vol. 66, pp. 4756–4766, 1989)

However, a high quality silicon monocrystalline layer is desirable for the device formation, but the presently highest quality monocrystalline silicon layer is one as formed by CVD method at substrate temperatures of 900° C. or greater.

That is, the device region is preferably a monocrystalline silicon layer grown at higher temperatures by CVD method, rather than a monocrystalline silicon layer grown by low temperature growth.

Accordingly, the low temperature growth is preferable for the growth of a monocrystalline Si layer on the porous silicon, and the high temperature growth is preferable for the formation of a monocrystalline Si layer on the device region, so that it is preferred that the monocrystalline growth is conducted within two regions at first and second temperatures.

According to the present invention, porous Si can be selectively etched chemically without etching of crystalline Si by the use of a wet chemical etching solution having no adverse effects on the semiconductor process.

Particularly, the selective etching method of porous Si according to the present invention can accomplish the objects of the present invention by using hydrofluoric acid (or buffered hydrofluoric acid, thereinafter abbreviated as BHF), a mixture of hydrofluoric acid (or BHF) and hydrogen peroxide, a mixture of hydrofluoric acid (or BHF) and alcohol, or a mixture of hydrofluoric acid (or BHF), hydrogen peroxide and alcohol, which has no etching reaction on the crystalline Si, as the selective etching solution.

The hydrogen peroxide within the selective wet chemical etching solution for the porous Si in this invention acts as an oxidant, whereby the reaction speed can be controlled by changing the ratio of hydrogen peroxide.

The alcohol in the selective wet chemical etching solution of porous Si in this invention acts as a surfactant, and serves to remove bubbles of reaction product gases generated as a result of the etching without delay from the surface being etched, thus ensuring a high efficiency and uniformity of the selective etching for porous Si.

According to the present invention, the porous Si contained in the same substrate as the crystalline Si can be etched chemically, using a solution for use in ordinary semiconductor process.

Also, if the substrate to be etched except for the porous silicon surface is covered with an anti-etching film for the etching, the selectivity of etching can be raised.

This anti-etching film can be formed by, for example, depositing $Si_3N_4$ about 0.1 μm thick by plasma CVD method to cover the entire member composed of two bonded substrates, and removing only the nitride film on the surface of porous substrate by reactive ion etching.

As the anti-etching film, Apiezon wax or electron wax may be used with the same effects, wherein porous Si substrate only can be completely removed.

The specific examples of the present invention will be described below.

EXAMPLE 1

First, anodization was conducted on a P-type (100) monocrystalline Si substrate having a thickness of 200 μm in a 50% HF solution. The current density at this time was 100 mA/cm$^2$. The porosity rate at this time was 8.4 μm/min, and the whole of the P-type (100) Si substrate having a thickness of 200 μm was made porous in twenty four minutes.

Then, 0.05 μm thick non-porous monocrystalline silicon epitaxial layer was grown at a low temperature on the P-type (100) porous Si substrate by bias sputtering. Deposition was conducted under the following conditions.

Cleaning Conditions for Substrate Surface

RF frequency: 100 MHz
High frequency power: 5 W
Temperature: 350° C.
Ar gas pressure: $15 \times 10^{-3}$ Torr
Cleaning time: 5 min.
Target D.C. bias: −5 V
Substrate D.C. bias: +5 V Deposition Conditions RF frequency: 100 MHz
High frequency power: 100 W
Temperature (first temperature): 380° C.
Ar gas pressure: $15 \times 10^{-3}$ Torr
Growth time: 4 min.
Growth film thickness: 0.05 μm
Target D.C. bias: −150 V
Substrate D.C. bias: +10 V Subsequently, a fuzed silica glass substrate optically polished was bonded on the surface of this epitaxial layer provided on the Si substrate, and heated at 600° C. for 0.5 hour in an oxygen atmosphere, so that both substrates could be strongly bonded.

Then, $Si_3N_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in a mixture solution (10:6:50) of 49% hydrofluoric acid, alcohol and 30% hydrogen peroxide without agitation. In sixty five minutes, the porous Si substrate was completely removed by the selective etching, with the monocrystal Si acting as an etch stopper, and the non-porous silicon monocrystalline layer only was left behind without being etched.

The etching rate of the non-porous Si monocrystal with respect to the etching solution was so low that the etching amount was less than 50 Å after sixty five minutes, with the selection ratio of the etching rate of the non-porous layer to that of the porous layer being as large as 1:10$^5$, and the ething amount of non-porous layer (several tens angstroms) could be ignored in a practical operation.

That is, the 200 μm thick porous Si substrate was removed with a result that the 0.05 μm thick monocrystalline Si layer remained on the fuzed silica glass substrate, after the removal of the $Si_3N_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Also, Apiezon Wax or electron wax can be used as the anti-etching film, in place of $Si_3N_4$ layer, with the same effects, and only the porous Si substrate can be completely removed.

Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 2

First, anodization was conducted on a P-type (100) monocrystalline Si substrate having a thickness of 200 μm in a 50% HF solution. The current density at this time was 100 mA/cm$^2$. The porosity rate at this time was 8.4 μm/min, and the whole of the P-type (100) Si substrate having a thickness of 200 μm was made porous in twenty four minutes.

Then, 0.1 μm thick Si epitaxial layer was grown at a low temperature on the P-type (100) porous Si substrate by MBE (Molecular Beam Epitaxy) method. Deposition was conducted under the following conditions.

Temperature (first temperature): 700° C.
Pressure: $1 \times 10^{-9}$ Torr
Growth rate: 0.1 nm/sec Subsequently, a fuzed silica glass substrate optically polished was bonded on the surface of this epitaxial layer, and heated at 700° C. for 0.5 hour in an oxygen atmosphere, so that both substrates could be strongly bonded.

Then, $Si_3N_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in a mixture solution (10:6:50) of BHF (a mixture solution of 36% hydrofluoric acid and 4.5% hydrofluoric acid), 49% hydrofluoric acid, alcohol and 30% hydrogen peroxide without agitation. In two hundreds five minutes, the porous Si substrate was completely removed by the selective etching, with the monocrystal Si acting as an etch stopper, and the monocrystalline Si layer only was left behind without being etched.

That is, the 200 μm thick porous Si substrate was removed with a result that the 0.1 μm thick monocrystalline Si layer remained on the $SiO_2$ after the removal of the $Si_3N_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 3

First, anodization was conducted on a P-type (100) monocrystalline Si substrate having a thickness of 200 μm in a 50% HF solution. The current density at this time was 100 mA/cm². The porosity rate at this time was 8.4 μm/min, and the whole of the P-type (100) Si substrate having a thickness of 200 μm was made porous in twenty four minutes.

Then, 0.1 μm thick Si epitaxial layer was grown at a low temperature on the P-type (100) porous Si substrate by plasma CVD method. Deposition was conducted under the following conditions.

Gas: $SiH_4$
High frequency power: 100 W
Temperature (first temperature): 800° C.
Pressure $1 \times 10^{-2}$ Torr
Growth rate: 2.5 nm/sec Subsequently, a fuzed silica glass substrate optically polished was bonded on the surface of this epitaxial layer, and heated at 800° C. for 0.5 hour in a nitrogen atmosphere, so that both substrates could be strongly bonded.

Then, $Si_3N_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in a mixture solution (1:5) of 49% hydrofluoric acid and 30% hydrogen peroxide with agitation. In sixty two minutes, the porous Si substrate was completely removed by the selective etching, with the monocrystal Si acting as an etch stopper, and the monocrystalline Si layer only was left behind without being etched.

That is, the 200 μm thick porous Si substrate was removed with a result that the 0.1 μm thick monocrystalline Si layer remained on the fuzed silica glass substrate after the removal of the $Si_3N_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 4

First, anodization was conducted on a P-type (100) monocrystalline Si substrate having a thickness of 200 μm in a 50% HF solution. The current density at this time was 100 mA/cm². The porosity rate at this time was 8.4 μm/min, and the whole of the P-type (100) Si substrate having a thickness of 200 μm was made porous in twenty four minutes.

Then, 0.5 m thick Si epitaxial layer was grown at a low temperature on the P-type (100) porous Si substrate by liquid phase growth method. Deposition was conducted under the following conditions.

Solvent: Sn
Growth temperature (first temperature): 900° C.
Growth atmosphere: $H_2$
Growth time: 5 min.

Subsequently, a fuzed silica glass substrate optically polished was bonded on the surface of this epitaxial layer provided on the Si substrate, and heated at 900° C. for 0.5 hour in a nitrogen atmosphere, so that both substrates could be strongly bonded.

Then, $Si_3N_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in a mixture solution (10:1) of 49% hydrofluoric acid and alcohol without agitation. In eighty two minutes, the porous Si substrate was completely removed by the selective etching, with the monocrystal Si acting as an etch stopper, and the monocrystalline Si layer only was left behind without being etched.

That is, the 200 μm thick porous Si substrate was removed with a result that the 0.5 μm thick monocrystalline Si layer remained on the fuzed silica glass substrate after the removal of the $Si_3N_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1.5 μm with excellent crystallinity maintained was formed.

On the other hand, there was no difference from the characteristics of normal bulk silicon with respect to the hole characteristics and other electrical characteristics.

EXAMPLE 5

Anodization was conducted on an N-type (100) monocrystalline Si substrate having a thickness of 200 μm in a 50% HF solution. The current density at this time was 100 $mA/cm^2$. The porosity rate at this time was 8.4 μm/min, and the whole of the N-type (100) Si substrate having a thickness of 200 μm was made porous in twenty four minutes.

Then, 0.5 μm thick Si epitaxial layer was grown at a low temperature on the N-type (100) porous Si substrate by low pressure CVD method. Deposition was conducted under the following conditions.

Source gas: $SiH_4$ ... 800 sccm
Carrier gas: $H_2$ ... 150 l/min
Temperature (first temperature): 850 ° C.
Pressure: $1 \times 10^{-2}$ Torr
Growth rate: 3.3 nm/sec Subsequently, a fuzed silica glass substrate optically polished was bonded on the surface of this epitaxial layer, and heated at 800° C. for 0.5 hour in an oxygen atmosphere, so that both substrates could be strongly bonded.

Then, $Si_3N_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in 49% hydrofluoric acid with agitation. In seventy eight minutes, the porous Si substrate was completely removed by the selective etching, with the monocrystal Si acting as an etch stopper, and the monocrystalline Si layer only was left behind without being etched.

That is, the 200 μm thick porous Si substrate was removed with a result that the 0.5 μm thick monocrystalline Si layer remained on the fuzed silica glass substrate after the removal of the $Si_3N_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: $SiH_2Cl_2$ ... 1000 sccm
Carrier gas: $H_2$ ... 230 l/min
Substrate temerature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1.5 μm with excellent crystallinity maintained was formed.

On the other hand, there was no difference from the characteristics of normal bulk silicon with respect to the hole characteristics and other electrical characteristics.

EXAMPLE 6

Anodization was conducted on a P-type (100) monocrystalline Si substrate having a thickness of 200 μm in a 50% HF solution. The current density at this time was 100 $mA/cm^2$. The porosity rate at this time was 8.4 μm/min, and the whole of the P-type (100) Si substrate having a thickness of 200 μm was made porous in twenty four minutes.

Then, 0.05 μm thick non-porous monocrystalline silicon epitaxial layer was grown at a low temperature on the P-type (100) porous Si substrate by bias sputtering. Deposition was conducted under the following conditions.

Cleaning Conditions for Substrate Surface

RF frequency: 100 MHz
High frequency power: 5 W
Temperature: 380° C.
Ar gas pressure: $15 \times 10^{-3}$ Torr
Cleaning time: 5 min.
Target D.C. bias: $-5$ V
Substrate D.C. bias: $+5$ V Deposition Conditions RF frequency: 100 MHz
High frequency power: 100 W
Temperature (first temperature): 380° C.
Ar gas pressure: $15 \times 10^{-3}$ Torr
Growth time: 4 min.
Growth film thickness: 0.05 μm
Target D.C. bias: $-150$ V
Substrate D.C. bias: $+10$ V Subsequently, a fuzed silica glass substrate optically polished was bonded on the surface of this epitaxial layer provided on the Si substrate, and heated at 600° C. for 0.5 hour in an oxygen atmosphere, so that both substrates could be strongly bonded.

Then, $Si_3N_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in a mixture solution (10:1) of buffered hydrofluoric acid (a mixture aqueous solution of 36% ammonium fluoride and 4.5% hydrofluoric acid) and alcohol without agitation. In two hundreds and seventy five minutes, the porous Si substrate was completely removed by the selective etching, with the monocrystal Si acting as an etch stopper, and the non-porous silicon monocrystalline layer only was left behind without being etched.

The etching rate of the non-porous Si monocrystal with respect to the etching solution was so low that the etching amount was less than 50 Å after two hundreds seventy five minutes, with the selection ratio of the etching rate of the non-porous layer to that of the porous layer being as large as 1:10$^5$, and the etching amount of non-porous layer (several tens angstroms) could be ignored in a practical operation.

That is, the 200 μm thick porous Si substrate was removed with a result that the 0.05 μm thick monocrystalline Si layer remained on the fuzed silica glass substrate, after the removal of the Si$_3$N$_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: SiH$_2$Cl$_2$ ... 1000 sccm
Carrier gas: H$_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 7

Anodization was conducted on a P-type (100) monocrystalline Si substrate having a thickness of 200 μm in a 50% HF solution. The current density at this time was 100 mA/cm$^2$. The porosity rate at this time was 8.4 μm/min, and the whole of the P-type (100) Si substrate having a thickness of 200 μm was made porous in twenty four minutes.

Then, 0.05 μm thick non-porous monocrystalline silicon epitaxial layer was grown at a low temperature on the P-type (100) porous Si substrate by bias sputtering. Deposition was conducted under the following conditions.

Cleaning Conditions for Substrate Surface

RF frequency: 100 MHz
High frequency power: 5 W
Temperature: 380° C.
Ar gas pressure: 15×10$^{-3}$ Torr
Cleaning time: 5 min.
Target D.C. bias: −5 V
Substrate D.C. bias: +5 V Deposition Conditions RF frequency: 100 MHz
High frequency power: 100 W
Temperature (first temperature): 380° C.
Ar gas pressure: 15×10$^{-3}$ Torr
Growth time: 4 min.
Growth film thickness: 0.05 μm
Target D.C. bias: −150 V
Substrate D.C. bias: +10 V Subsequently, a fuzed silica glass substrate optically polished was bonded on the surface of this epitaxial layer provided on the Si substrate, and heated at 600° C. for 0.5 hour in an oxygen atmosphere, so that both substrates could be strongly bonded.

Then, Si$_3$N$_4$ as the anti-etching film was deposited 0.1 μm thick by plasma CVD method to cover two bonded substrates, and only the nitride film on the porous substrate was removed by reactive ion etching.

Thereafter, selective etching was conducted on the bonded substrates in a mixture solution (1:5) of buffered hydrofluoric acid (a mixture aqueous solution of 36% ammonium fluoride and 4.5% hydrofluoric acid) and 30% hydrogen peroxide with agitation. In one hundred ninety minutes, the porous Si substrate was completely removed by the selective etching, with the monocrystal Si acting as an etch stopper, and the non-porous silicon monocrystalline layer only was left behind without being etched.

That is, the 200 μm thick porous Si substrate was removed with a result that the 0.05 μm thick monocrystalline Si layer remained on the fuzed silica glass substrate, after the removal of the Si$_3$N$_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: SiH$_2$Cl$_2$ ... 1000 sccm
Carrier gas: H$_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 8

Anodization was conducted on a P-type (100) monocrystalline Si substrate having a thickness of 200 μm in a 50% HF solution. The current density at this time was 100 mA/cm$^2$. The porosity rate at this time was 8.4 μm/min, and the whole of the P-type (100) Si substrate having a thickness of 200 μm was made porous in twenty four minutes.

Then, 0.05 μm thick non-porous monocrystalline silicon epitaxial layer was grown at a low temperature on the P-type (100) porous Si substrate by bias sputtering. Deposition was conducted under the following conditions.

Cleaning Conditions for Substrate Surface

RF frequency: 100 MHz
High frequency power: 5 W
Temperature: 380° C.
Ar gas pressure: 15×10$^{-3}$ Torr
Cleaning time: 5 min.
Target D.C. bias: −5 V
Substrate D.C. bias: +5 V Deposition Conditions RF frequency: 100 MHz
High frequency power: 100 W
Temperature (first temperature): 380° C.
Ar gas pressure 15×10$^{-3}$ Torr
Growth time: 4 min
Growth film thickness: 0.05 μm
Target D.C. bias: −150 V
Substrate D.C. bias: +10 V Subsequently, a fuzed silica glass substrate optically polished was bonded on the surface of this epitaxial layer provided on the Si substrate, and heated at 600° C. for 0.5 hour in an oxygen atmosphere, so that both substrates could be strongly bonded.

Then, $Si_3N_4$ as the anti-etching film was deposited 0.1 μm thick. by plasma CVD method to cover two bonded substrates, and only the nitride film on the porous substrate was removed by reactive ion etching.

Thereafter, selective etching was conducted on the bonded substrates in a buffered hydrofluoric acid (a mixture aqueous solution of 36% ammonium fluoride and 4.5% hydrofluoric acid) with agitation. In two hundreds fifty eight minutes, the porous Si substrate was completely removed by the selective etching, with the monocrystal Si acting as an etch stopper, and the non-porous silicon monocrystalline layer only was left behind without being etched.

That is, the 200 μm thick porous Si substrate was removed with a result that the 0.05 μm thick monocrystalline Si layer remained on the fuzed silica glass substrate, after the removal of the $Si_3N_4$ layer as the anti-etching film.

Then a high quality epitaxial Si monocrystalline film was deposited 1 μm thick on the non-porous silicon monocrystal by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 9

Anodization was conducted on a P-type (100) monocrystalline Si substrate having a thickness of 200 μm in a 50% HF solution.

The conditions for anodization are shown below.
Voltage applied: 2.6 (V)
Current density: 30 ($mA \cdot cm^{-2}$)
Anodizing solution: $HF:H_2O:C_2H_5OH = 1:1:1$
Time: 1.6 hours
Thickness of porous Si: 200 (μm)
Porosity: 56 (%)

Then, 0.05 μm thick silicon epitaxial layer was grown at a low temperature on the P-type (100) porous Si substrate by bias sputtering (thereinafter referred to as BS method). Deposition was conducted under the following conditions.

Surface Cleaning Conditions

Temperature: 380° C.
Atmosphere: Ar
Pressure: 15 m Torr
Substrate voltage 5 V
Target voltage: −5 V
High frequency power: 5 W
RF frequency: 100 MHz
Deposition Conditions
RF frequency: 100 MHz
High frequency power: 100 W
Temperature (first temperature): 380° C.
Ar gas pressure: 15 m Torr
Growth time: 4 min.
Film thickness: 0.05 μm
Target D.C. bias: −150 V
Substrate D.C. bias: +10 V Subsequently, an Si substrate having a 5000 Å thick oxide layer formed on the reverse surface was bonded on the surface of this epitaxial layer, and heated at 600° C. for 0.5 hour in an oxygen atmosphere, so that both substrates could be strongly bonded.

Thereafter, selective etching was conducted on the bonded substrates in a mixture solution (10:6:50) of 49% hydrofluoric acid, alcohol and 30% hydrogen peroxide without agitation. In sixty five minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that 0.05 μm thick non-porous silicon monocrystalline layer remained on the $SiO_2$.

Then a high quality epitaxial Si monocrystalline film was deposited 1 μm thick on the non-porous monocrystalline Si by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer with the BS method or CVD method and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 10

Anodization was conducted on a P-type (100) monocrystalline Si substrate having a thickness of 200 μm in an HF solution.

The conditions for anodization are the same as those of example 9.

Then, 0.1 μm thick non-porous silicon monocrystalline epitaxial layer was grown at a low temperature on the P-type (100) porous Si substrate by MBE (Molecular Beam Epitaxy). Deposition was conducted under the following conditions.

Temperature (first temperature): 700° C.
Pressure: $1 \times 10^{-9}$ Torr
Growth rate: 0.1 nm/sec Subsequently, an Si substrate formed with a 5000 Å thick oxide layer on the opposite surface was bonded on the surface of this epitaxial layer, and heated at 700° C. for 0.5 hour in an oxygen atmosphere, so that both substrates could be strongly bonded.

Thereafter, selective etching was conducted on the bonded substrates in a mixture solution (10:6:50) of buffered hydrofluoric acid (a mixture aqueous solution of 36% ammonium fluoride and 4.5% hydrofluoric acid), alcohol and 30% hydrogen peroxide without agitation. In two hundreds five minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that the 0.1 μm thick non-porous silicon monocrystalline layer remained on the $SiO_2$.

Then a high quality epitaxial film was deposited 5 μm thick on the non-porous monocrystalline Si by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 10 min Observing the cross-section with a transmission electron microscope, it was confirmed that no crystal defects were newly introduced into the Si layer with the MBE method or CVD method and excellent crystallinity was maintained.

On the other hand, there was no difference from the characteristics of normal bulk silicon with respect to the hole characteristics and other electrical characteristics.

EXAMPLE 11

Anodization was conducted on a P-type (100) monocrystalline Si substrate having a thickness of 200 μm in an HF solution.

The condition for anodization are shown below.
Voltage applied: 2.6 (V)
Current density: 30 ($mA \cdot cm^{-2}$)
Anodizing solution: $HF:H_2O:C_2H_5OH = 1:1:1$
Thickness of porous Si: 200 (μm)
Porosity: 56 (%)

Then, 0.1 μm thick Si epitaxial layer was grown at a low temperature on the P-type (100) porous Si substrate by plasma CVD method. Deposition was conducted under the following conditions.

Gas: $SiH_4$
High frequency power: 100 W
Temperature (first temperature): 800° C.
Pressure: $1 \times 10^{-2}$ Torr
Growth rate: 2.5 nm/sec Subsequently, an Si substrate having a 5000 Å thick oxide layer formed on the reverse surface was bonded on the surface of this epitaxial layer, and heated at 800° C. for 0.5 hour in a nitrogen atmosphere, so that both substrates could be strongly bonded.

Thereafter, selective etching was conducted on the bonded substrates in a mixture solution (1:5) of 49% hydrofluoric acid and 30% hydrogen peroxide with agitation. In sixty two minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that the 0.1 μm thick non-porous silicon monocrystalline layer remained on the $SiO_2$.

Then a high quality epitaxial film was deposited 5 μm thick on the non-porous monocrystalline Si by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 10 min Observing the cross-section with a transmission electron microscope, it was confirmed that no crystal defects were newly introduced into the Si layer and excellent crystallinity was maintained.

On the other hand, there was no difference from the characteristics of normal bulk silicon with respect to the hole characteristics and other electrical characteristics.

EXAMPLE 12

Anodization was conducted on a P-type (100) monocrystalline Si substrate having a thickness of 200 μm in an HF solution.

The conditions for anodization are shown below.
Voltage applied: 2.6 (V)
Current density: 30 ($mA \cdot cm^{-2}$)
Anodizing solution: $HF:H_2O:C_2H_5OH = 1:1:1$
Thickness of porous Si: 200 (μm)
Porosity: 56 (%)

Then, 0.5 μm thick non-porous silicon monocrystalline epitaxial layer was grown at a low temperature on the P-type (100) porous Si substrate by liquid phase growth method. Deposition was conducted under the following conditions.

Solvent: Sn
Growth temperature: 900° C.
Growth atmosphere: $H_2$
Growth time: 5 min Subsequently, an Si substrate having a 5000 Å thick oxide layer formed on the reverse surface was bonded on the surface of this epitaxial layer, and heated at 900° C. for 0.5 hour in a nitrogen atmosphere, so that both Si substrates could be strongly bonded.

Thereafter, selective etching was conducted on the bonded substrates in a mixture solution (10:1) of 49% hydrofluoric acid and alcohol without agitation. In eighty two minutes, the porous Si substrate was completely removed by the selective etching, with the monocrystalline Si acting as an etch stopper, and the non-porous silicon monocrystalline layer only was left behind without being etched.

That is, the 200 μm thick porous Si substrate was removed with a result that the 0.5 μm thick monocrystalline Si layer remained on the $SiO_2$.

Then a high quality epitaxial film was deposited 5 μm thick on the non-porous monocrystalline Si by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 10 min Observing the cross-section with a transmission electron microscope, it was confirmed that no crystal defects were newly introduced into the Si layer and excellent crystallinity was maintained.

On the other hand, there was no difference from the characteristics of normal bulk silicon with respect to the hole characteristics and other electrical characteristics.

EXAMPLE 13

Anodization was conducted on an N-type (100) monocrystalline Si substrate having a thickness of 200 μm in an HF solution.

The conditions for anodization are shown below.
Voltage applied: 2.6 (V)
Current density: 30 (mA·cm$^{-2}$)
Anodizing solution: HF:H$_2$O:C$_2$H$_5$OH=1:1:1
Thickness of porous Si: 200 (μm)
Porosity: 56 (%)

Then, 0.1 μm thick Si epitaxial layer was grown on the P-type (100) porous Si substrate low pressure CVD method. Deposition was conducted under the following conditions.
Source gas: SiH$_4$
Carrier gas: H$_2$
Temperature (first temperature): 850° C.
Pressure: 1×10$^{-2}$ Torr
Growth rate: 3.3 nm/sec Subsequently, an Si substrate having a 5000 Å thick oxide layer formed on the reverse surface was bonded on the surface of this epitaxial layer, and heated at 800° C. for 0.5 hour in an oxygen atmosphere, so that both Si substrates could be strongly bonded.

Thereafter, selective etching was conducted on the bonded substrates in 49% hydrofluoric acid with agitation. In seventy eight minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that the 0.1 μm thick monocrystalline Si layer remained on the SiO$_2$.

Then a high quality epitaxial film was deposited 1 μm thick on the non-porous monocrystalline Si by ordinary CVD method. Deposition was conducted under the following conditions.
Source gas: SiH$_2$Cl$_2$ ... 1000 sccm
Carrier gas: H$_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and excellent crystallinity was maintained.

On the other hand, there was no difference from the characteristics of normal bulk silicon with respect to the hole characteristics and other electrical characteristics.

EXAMPLE 14

Anodization was conducted on a P-type (100) monocrystalline Si substrate having a thickness of 200 μm in an HF solution.

The conditions for anodization are shown below.
Voltage applied: 2.6 (V)
Current density: 30 (mA·cm$^{-2}$)
Anodizing solution: HF:H$_2$O:C$_2$H$_5$OH=1:1:1
Time: 1.6 hours
Thickness of porous Si: 200 (μm)
Porosity: 56 (%)

Then, 0.05 μm thick Si epitaxial layer was grown on the P-type (100) porous Si substrate by bias sputtering method (thereinafter referred as BS method). Deposition was conducted under the following conditions.

Surface Cleaning Conditions
Temperature: 380° C.
Atmosphere: Ar
Pressure: 15 m Torr
Substrate voltage: 5 V
Target voltage: −5 V
High frequency power: 5 W
RF frequency: 100 MHz Deposition Conditions
RF frequency: 100 MHz
High frequency power: 100 W
Temperature (first temperature): 380° C.
Ar gas pressure: 15 m Torr
Growth time: 4 min
Film thickness: 0.05 μm
Target D.C. voltage: −150 V
Substrate D.C. voltage: +10 V Subsequently, an Si substrate having a 5000 Å thick oxide layer formed on the reverse surface was bonded on the surface of this epitaxial layer, and heated at 600° C. for 0.5 hour in an oxygen atmosphere, so that both substrates could be strongly bonded.

Thereafter, selective etching was conducted on the bonded substrates in a mixture solution (10:1) of buffered hydrofluoric acid (a mixture aqueous solution of 36% ammonium fluoride and 4.5% hydrofluoric acid) and alcohol without agitation. In two hundreds seventy five minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that the 0.05 μm thick non-porous silicon monocrystalline layer remained on the SiO$_2$.

Then a high quality epitaxial Si monocrystalline film was deposited 1 μm thick on the non-porous monocrystalline Si by ordinary CVD method.

Deposition was conducted under the following conditions.
Source gas: SiH$_2$Cl$_2$ ... 1000 sccm
Carrier gas: H$_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer with the BS method or CVD method and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 15

Anodization was conducted on a P-type (100) monocrystalline Si substrate having a thickness of 200 μm in an HF solution.

The conditions for anodization are shown below.
Voltage applied: 2.6 (V)
Current density: 30 (mA·cm$^{-2}$)
Anodizing solution: HF:H$_2$O:C$_2$H$_5$OH=1:1:1
Time: 1.6 hours
Thickness of porous Si: 200 (μm)
Porosity: 56 (%)

Then, 0.05 μm thick Si epitaxial layer was grown on the P-type (100) porous Si substrate by bias sputtering method (thereinafter abbreviated as BS method). Deposition was conducted under the following conditions.

Surface Cleaning Conditions

Temperature: 380° C.
Atmosphere: Ar
Pressure: 15 m Torr
Substrate voltage: 5 V
Target voltage: −5 V
High frequency power: 5 W
RF frequency: 100 MHz Deposition Conditions RF frequency: 100 MHz
High frequency power: 100 W
Temperature (first temperature): 380° C.
Ar gas pressure: 15 m Torr
Growth time: 4 min
Film thickness: 0.05 μm
Target D.C. voltage: −150 V
Substrate D.C. voltage: +10 V Subsequently, an Si substrate having a 5000 Å thick oxide layer formed on the reverse surface was bonded on the surface of this epitaxial layer, and heated at 600° C. for 0.5 hour in an oxygen atmosphere, so that both substrates could be strongly bonded.

Thereafter, selective etching was conducted on the bonded substrates in a mixture solution (1:5) of buffered hydrofluoric acid (a mixture aqueous solution of 36% ammonium fluoride and 4.5% hydrofluoric acid) and 30% hydrogen peroxide with agitation. In one hundred ninety minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that the 0.05 μm thick non-porous silicon monocrystalline layer remained on the $SiO_2$.

Then a high quality epitaxial Si monocrystalline film was deposited 1 μm thick on the non-porous monocrystalline Si by ordinary CVD method. Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer and the SOI structure having a thickness of about 1 μm with excellent crystallinity maintained was formed.

On the other hand, there was no difference from the characteristics of normal bulk silicon with respect to the hole characteristics and other electrical characteristics.

EXAMPLE 16

Anodization was conducted on a P-type (100) monocrystalline Si substrate having a thickness of 200 μm in an HF solution.

The conditions for anodization are shown below.
Voltage applied: 2.6 (V)
Current density: 30 (mA·cm$^{-2}$)
Anodizing solution: $HF:H_2O:C_2H_5OH = 1:1:1$
Time: 1.6 hours Thickness of porous Si: 200 (μm)
Porosity: 56 (%)

Then, 0.05 μm thick Si epitaxial layer was grown at a low temperature on the P-type (100) porous Si substrate by bias sputtering method (thereinafter abbreviated as BS method). Deposition was conducted under the following conditions.

Surface Cleaning Conditions

Temperature: 380° C.
Atmosphere: Ar
Pressure: 15 m Torr
Substrate voltage: 5 V
Target voltage: −5 V
High frequency power: 5 W
RF frequency: 100 MHz Deposition Conditions RF frequency: 100 MHz
High frequency power: 100 W
Temperature (first temperature): 380° C.
Ar gas pressure: 15 m Torr
Growth time: 4 min
Film thickness: 0.05 μm
Target D.C. voltage: −150 V
Substrate D.C. voltage: +10 V Subsequently, an Si substrate having a 5000 Å thick oxide layer formed on the reverse surface was bonded on the surface of this epitaxial layer, and heated at 600° C. for 0.5 hour in an oxygen atmosphere, so that both substrates could be strongly bonded.

Thereafter, selective etching was conducted on the bonded substrates in buffered hydrofluoric acid (a mixture aqueous solution of 36% ammonium fluoride and 4.5% hydrofluoric acid) with agitation. In two hundreds fifty eight minutes, the porous Si substrate was completely removed by the selective etching, with the non-porous silicon monocrystal acting as an etch stopper, and the non-porous silicon monocrystalline layer only was left behind without being etched.

That is, the 200 μm thick porous Si substrate was removed with a result that the 0.05 μm thick non-porous silicon monocrystalline layer remained on the $SiO_2$.

Then a high quality epitaxial Si monocrystalline film was deposited 1 μm thick on the non-porous monocrystalline Si by ordinary CVD method.

Deposition was conducted under the following conditions.

Source gas: $SiH_2Cl_2$ ... 1000 sccm
Carrier gas: $H_2$ ... 230 l/min
Substrate temperature (second temperature): 1080° C.
Pressure: 80 Torr
Growth time: 2 min Observing the cross-section with a transmission electron microscope, it was confirmed that no crystal defects were newly introduced into the Si layer with the BS method or the CVD method and the SOI structure having a thickness of about 1 μm with excellent crystallinity maintained was formed.

On the other hand, there was no difference from the characteristics of normal bulk silicon with respect to the hole characteristics and other electrical characteristics.

What is claimed is:

1. A method for preparing a semiconductor member, characterized by including the steps of:
    making a silicon substrate porous;

forming a non-porous silicon monocrystalline layer on said porous silicon substrate at a first temperature;

bonding a surface of said non-porous silicon monocrystalline layer on to another substrate having an insulating material on the surface thereof;

etching the porous silicon by removing said porous silicon of said bonded substrate by chemical etching; and forming a monocrystalline silicon layer on said non-porous silicon monocrystalline layer by epitaxial growth at a second temperature higher than said first temperature.

2. The method according to claim 1, wherein said another substrate having an insulating material on the surface thereof is a light transparent glass substrate.

3. The method according to claim 1, wherein said another substrate having an insulating material on the surface thereof is a silicon substrate.

4. The method for preparing a semiconductor member according to claim 1, characterized in that the method of growing epitaxially a monocrystalline silicon layer at said second temperature is a CVD method.

5. The method for preparing a semiconductor member according to claim 1, characterized in that the sum of the thickness of said non-porous silicon monocrystalline layer formed on said porous silicon substrate at said first temperature and the thickness of said monocrystalline silicon layer formed at said second temperature is 100 μm or less.

6. The method for preparing a semiconductor member according to claim 1, characterized in that said non-porous silicon monocrystalline layer formed at said first temperature is formed by epitaxial growth.

7. The method for preparing a semiconductor member according to claim 1, characterized in that said non-porous silicon monocrystalline layer formed at said first temperature is formed by a method which is selected from the bias sputtering method, the molecular beam epitaxial method, the plasma CVD method, the photo assisted CVD method, the liquid phase growth method, and the CVD method.

8. The method for preparing a semiconductor member according to claim 1, characterized in that said second temperature is 900° C. or greater.

9. The method for preparing a semiconductor member according to claim 1, characterized in that said process of making porosity is anodization.

10. The method for preparing a semiconductor member according to claim 7, characterized in that said anodization is conducted in an HF solution.

11. The method for preparing a semiconductor member according to claim 1, characterized in that said etching process is carried out after the portion except for said porous silicon surface is covered with an anti-etching film.

* * * * *